United States Patent
Brown et al.

(10) Patent No.: US 7,746,722 B2
(45) Date of Patent: Jun. 29, 2010

(54) METAL PROGRAMMABLE SELF-TIMED MEMORIES

(75) Inventors: Jeffrey Scott Brown, Fort Collins, CO (US); Chang Jung, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 12/140,502

(22) Filed: Jun. 17, 2008

(65) Prior Publication Data

US 2008/0253206 A1    Oct. 16, 2008

Related U.S. Application Data

(63) Continuation of application No. 10/706,110, filed on Nov. 12, 2003, now Pat. No. 7,400,543.

(51) Int. Cl.
*G11C 8/00*    (2006.01)

(52) U.S. Cl. ............... 365/233.1; 365/205; 365/230.06; 365/51; 365/63; 365/233.5

(58) Field of Classification Search ............... 365/210.1, 365/200, 205, 233.1, 201, 230.06, 51, 63, 365/233.5
See application file for complete search history.

(56) References Cited

U.S. PATENT DOCUMENTS

| | | | |
|---|---|---|---|
| 6,229,746 B1 * | 5/2001 | Tooher | 365/210.1 |
| 6,542,434 B1 | 4/2003 | Monzel | |
| 6,674,661 B1 * | 1/2004 | Becker | 365/104 |
| 6,870,777 B2 * | 3/2005 | Maki | 365/210.1 |
| 6,876,587 B2 | 4/2005 | Ashizawa et al. | |

* cited by examiner

*Primary Examiner*—David Lam
(74) *Attorney, Agent, or Firm*—Yee & Associates, P.C.

(57) ABSTRACT

A self-timed memory array is disclosed, in which segmentability and metal-programmability are supported while minimizing layout space. Self-timing row decoder circuits are placed at the top and bottom of the array adjacent to respective I/O blocks. A self-timing signal is routed from the top (resp. bottom) of the array to a point halfway down (resp. up) the memory array and then back to a self-timing row decoder at the top (resp. bottom) of the array. The same approach may also be used to account for the bitline wire delay from the bottom (resp. top) of the array to the sense amplifiers in the I/O block. Further flexibility in wire routing is provided by eliminating metal routing layers from unneeded memory cells, and a programmable gate array may be used to allow an arbitrary word size to be chosen for the memory.

7 Claims, 5 Drawing Sheets

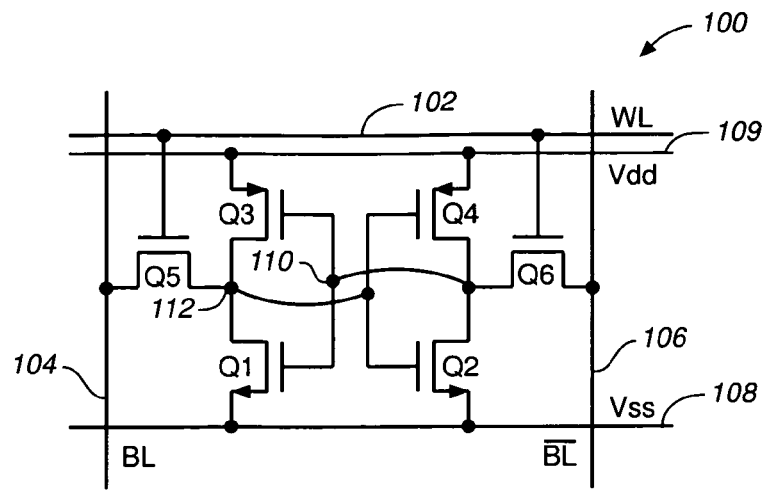
FIG._1 (PRIOR ART)
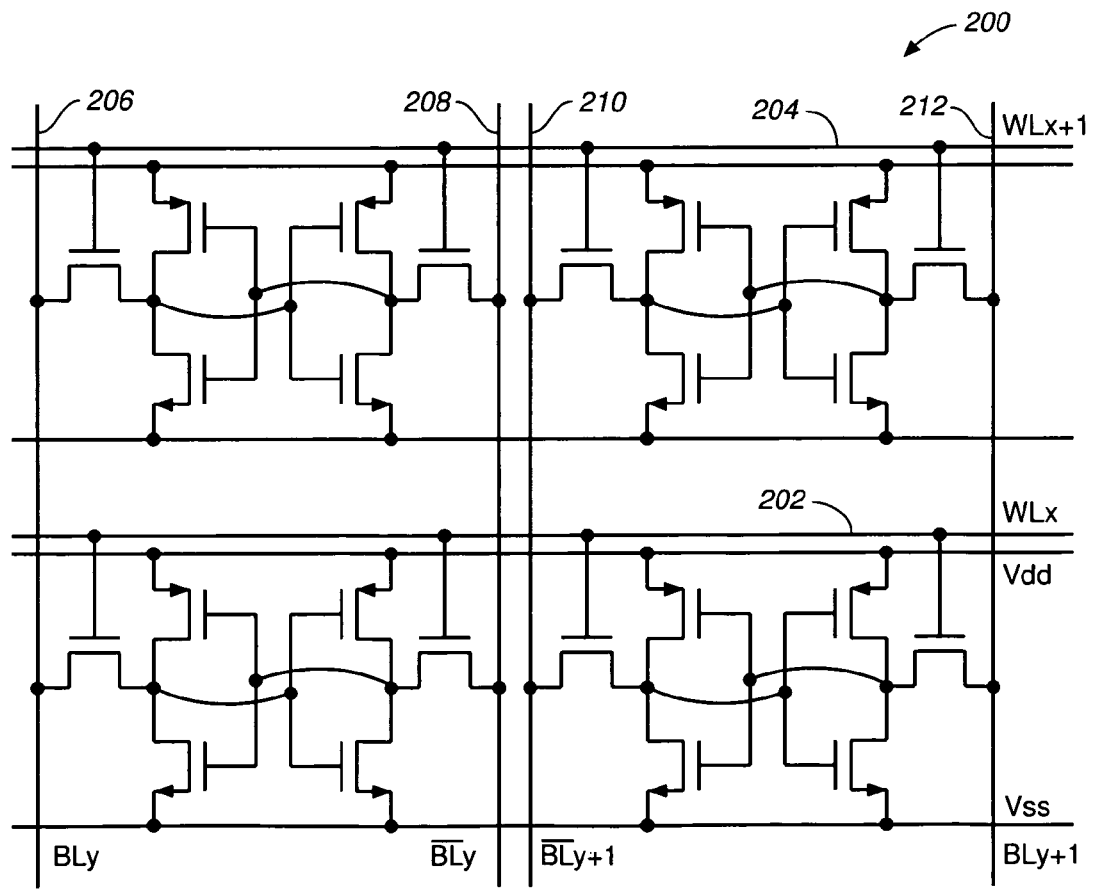
FIG._2 (PRIOR ART)

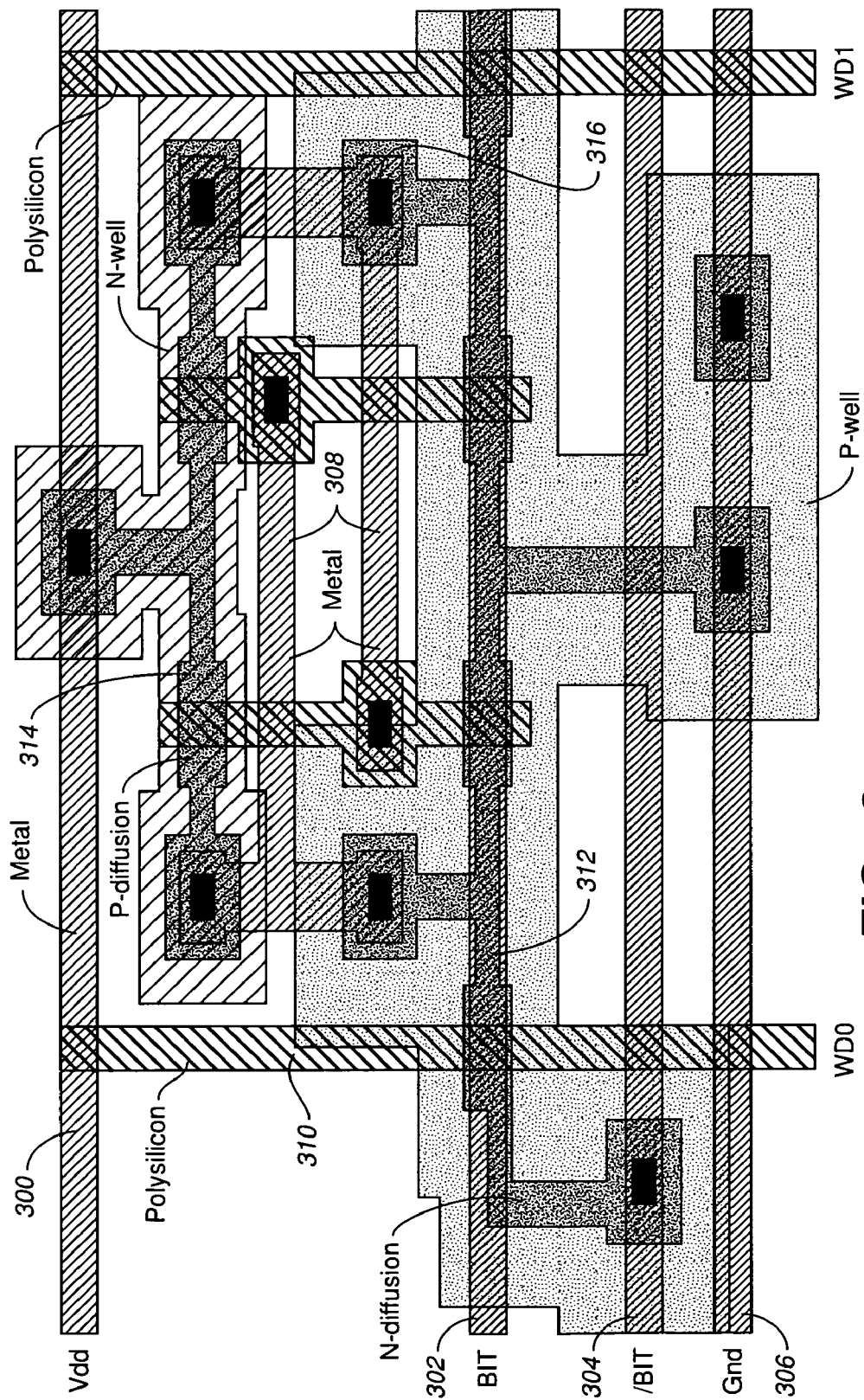
FIG._3

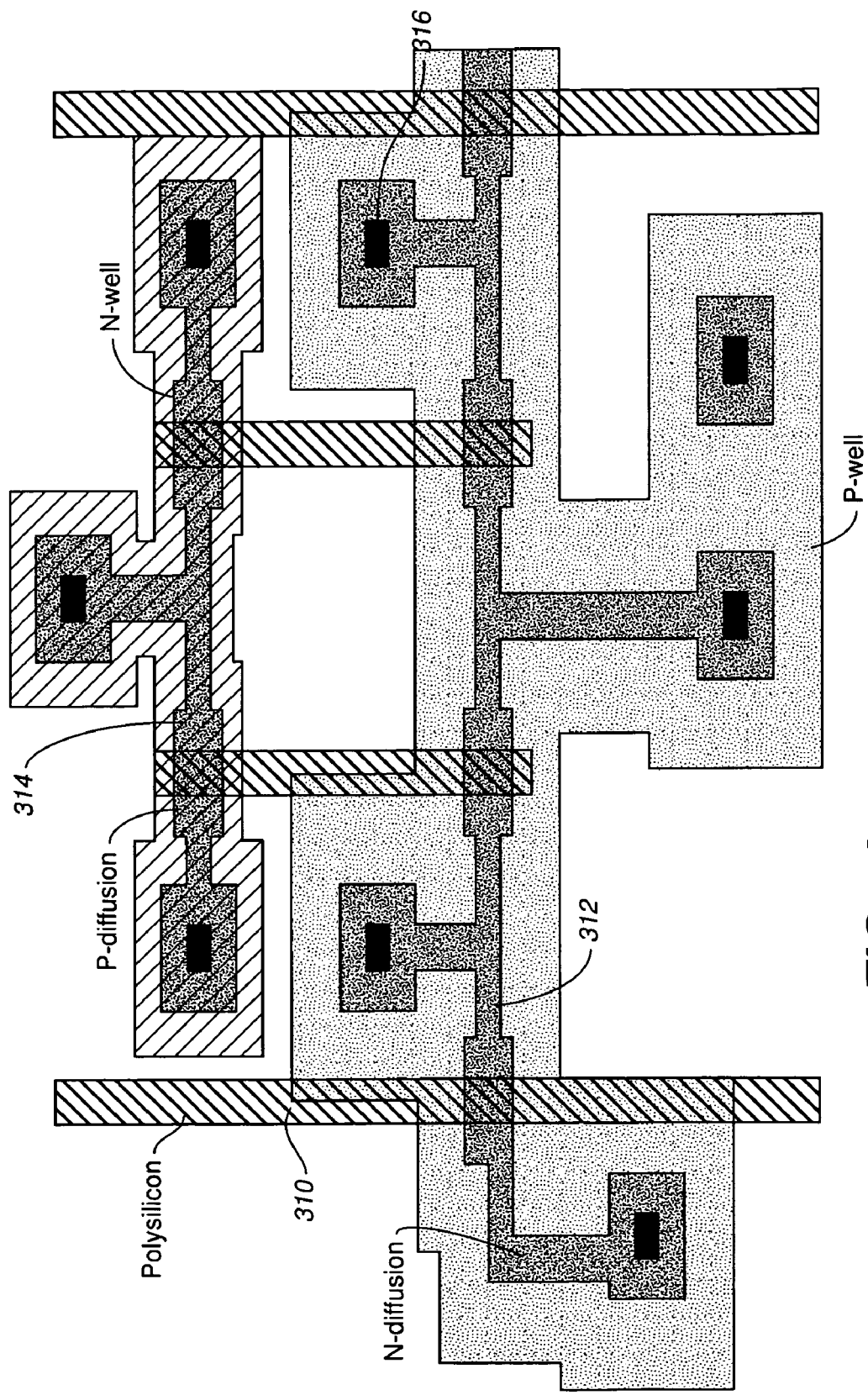
FIG._4

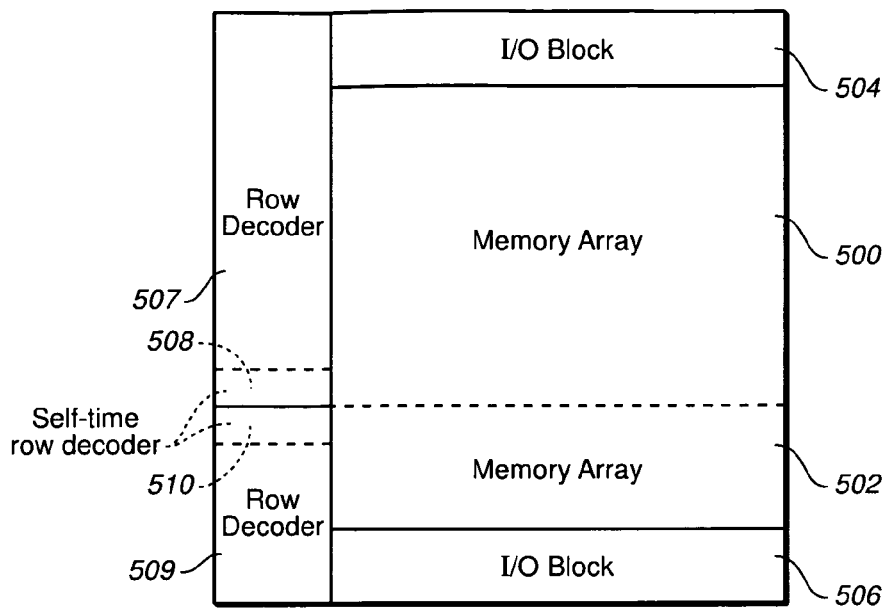
FIG._5 *(PRIOR ART)*
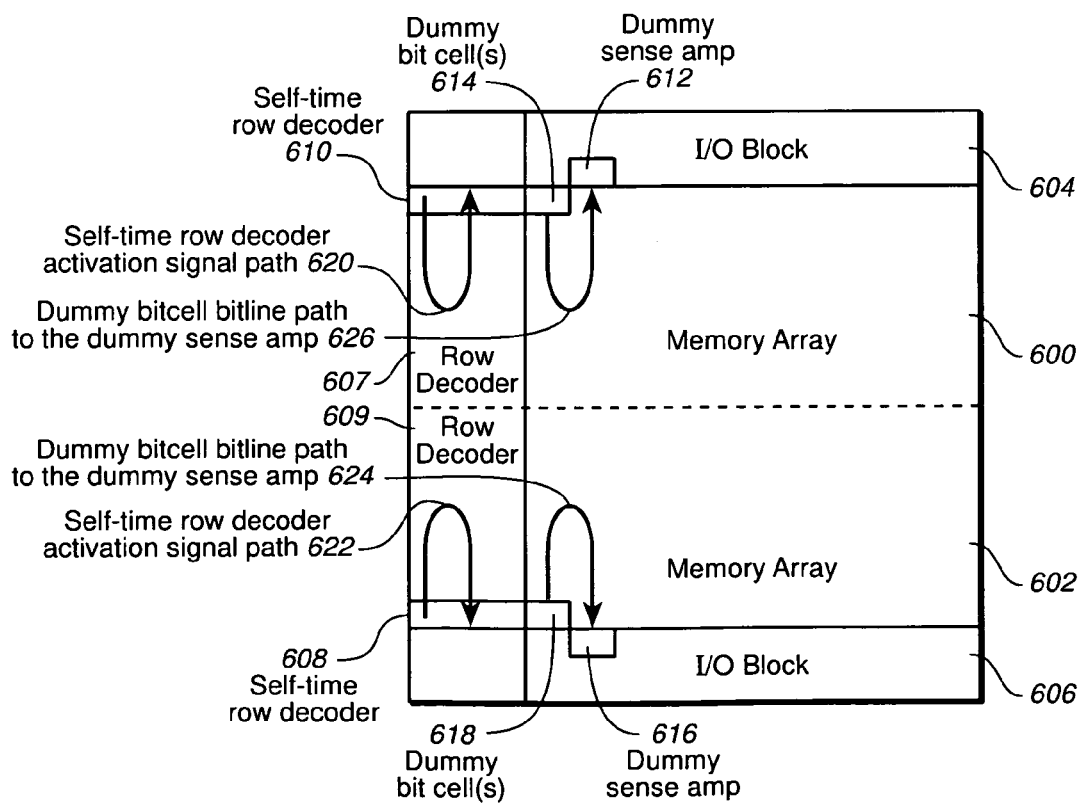
FIG._6

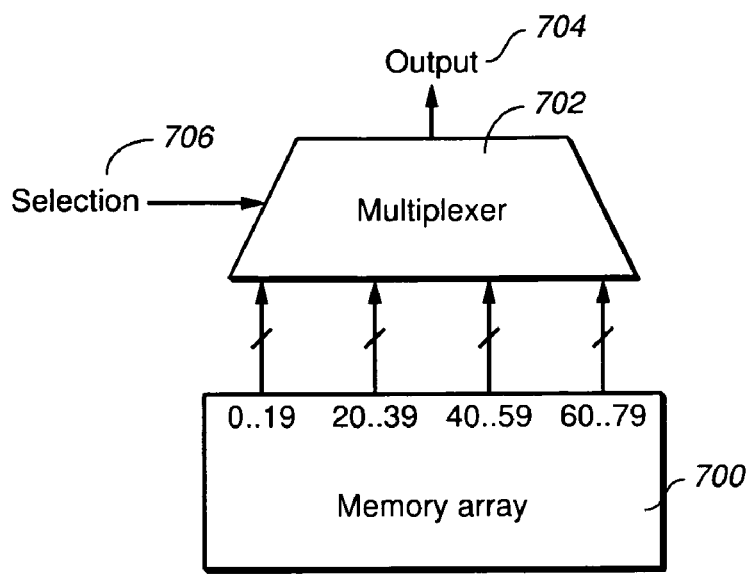
FIG._7
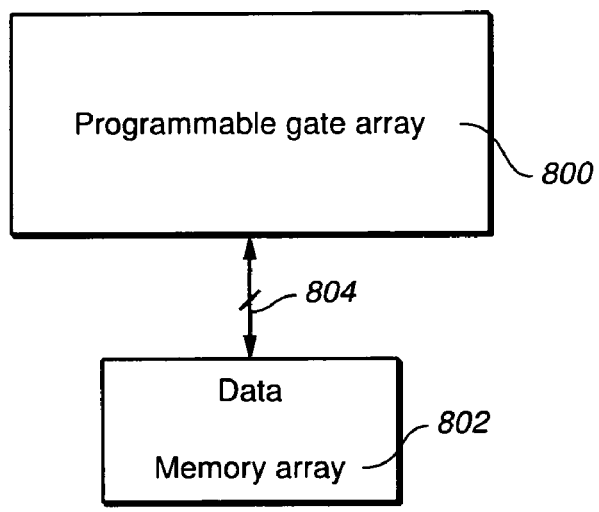
FIG._8
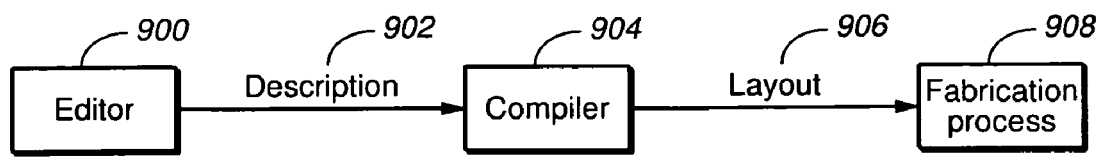
FIG._9

METAL PROGRAMMABLE SELF-TIMED MEMORIES

This application is a continuation of application Ser. No. 10/706,110, filed Nov. 12, 2003 now U.S. Pat. No. 7,400,543, status i.e., allowed.

BACKGROUND OF THE INVENTION

1. Technical Field

The present invention is directed generally toward a method and apparatus for implementing a self-timed static random-access memory in an integrated circuit.

2. Description of the Related Art

There are two basic types of semiconductor random-access memory (RAM) circuits in common use. Static random-access memory (SRAM) stores data by way of a feedback circuit. Dynamic random-access memory (DRAM) stores data as electrostatic charge on a capacitor. In general, RAM circuits are configured in two-dimensional arrays of individual memory cells, with each memory cell storing one bit. A word of data may be accessed from one or more memory circuits by addressing the cells that store the data by row and column addresses and reading or writing data to or from the addressed cells. In a typical SRAM array, each memory word is stored in a separate row and addressed by asserting a "word line," while the individual bits of each word are read from and written to the memory array using "bit lines." In a typical single-port memory array, all bit lines for a particular bit position are connected together. For example, all memory cells representing bit position 4 of a word typically share common bit lines, but have separate word lines. The generic term for word lines and bit lines is "address lines," as address lines are used for addressing individual memory cells.

Memory circuits may be single-port or multi-port memory circuits. Single-port circuits are capable of allowing access to a single memory location (i.e., one cell or a group of cells at a single memory address). Multi-port circuits allow two or more memory addresses to be accessed concurrently. Specifically, a "port" is a set of related address lines that together are sufficient to perform one memory access at a particular point in time. Thus, a single-port memory cell, which only has one port, is capable of supporting only one access at a time, while a dual-port memory cell, which has two ports, is capable of supporting two simultaneous memory accesses. Higher-order multi-port cells (e.g., three-port, four-port, etc. . . . ), which support larger numbers of simultaneous accesses, are also possible.

FIG. 1 is a diagram of a typical six-transistor single-port complementary metal-oxide semiconductor (CMOS) SRAM circuit 100 as known in the art. SRAM circuit 100 is perhaps the most common circuit topology for a single-port SRAM. SRAM circuit 100 includes a flip-flop circuit, which is formed by cross-coupling two logic inverters formed by transistors Q1-Q4, and two pass-gate transistors (also called access transistors) Q5 and Q6.

Specifically, PMOS (p-channel MOS) transistor Q3 and NMOS (n-channel MOS) transistor Q1 form one CMOS inverter and PMOS transistor Q4 and NMOS transistor Q2 form another CMOS inverter. Referring to the inverter formed by transistors Q3 and Q1, the gates of transistors Q3 and Q1 are connected together to form an input node 110 to the inverter. The sources of transistors Q3 and Q1 are connected together to form an output node 112 of the inverter. The drain of transistor Q3 is connected to positive supply rail Vdd 106, making transistor Q3 the "pull-up" transistor of the inverter. The drain of transistor Q1 is connected to negative (or "low") supply rail Vss 108, making transistor Q1 the "pull-down" transistor of the inverter. Transistors Q4 and Q2 are similarly configured as a CMOS inverter. In SRAM circuit 100, the CMOS inverter formed by transistors Q4 and Q2 is cross-coupled with the CMOS inverter formed by transistors Q3 and Q1. Thus, node 110, which is the input node of the inverter formed by transistors Q3 and Q1, forms the output node of the inverter formed by transistors Q4 and Q2, and node 112, which is the output node of the inverter formed by transistors Q3 and Q1, forms the input node of the inverter formed by transistors Q4 and Q2.

Nodes 110 and 112 are referred to as the "internal nodes" of SRAM circuit 100. For the purposes of this document, the term "internal node" is defined as a data-storing node in an SRAM circuit. In the case of circuit 100, nodes 110 and 112, because they form part of the feedback loop of the cross-connected CMOS inverters (transistors Q1-Q4), are data-storing nodes and are, therefore, "internal nodes," for the purposes of this document.

Pass-gate transistors Q5 and Q6 are MOS transistors configured as switches. The gates of transistors Q5 and Q6 are connected to word line 102. The source and drain of pass-gate transistor Q5 are connected between bit line 104 and node 112. The source and drain of pass-gate transistor Q6 are connected between inverse bit line 106 and node 110. Pass-gate transistors Q5 and Q6 are turned on when word line 102 is selected (i.e., raised in voltage) and connect bit lines 104 and 106 to the flip-flop formed by transistors Q1-Q4. When pass-gate transistors Q5 and Q6 switch bit lines 104 and 106 into connection with internal nodes 110 and 112, the data stored by memory circuit 100 becomes available on bit line 104, and the complement of that data becomes available on inverse bit line 106, so reading from memory circuit 100 becomes possible. To write data to memory circuit 100, word line 102 is selected, the data to be stored is asserted on bit line 104, and the complement of that data is asserted on inverse bit line 106. Since transistors Q1-Q4 form a bistable circuit (i.e., a circuit with two stable states), asserting the new data on bit lines 104 and 106 results in putting this bistable circuit into the stable state associated with the stored data. When word line 102 is no longer asserted, transistors Q1-Q4 maintain the same stable state, and thus store the written data until power is no longer available from power supply rails 108 and 109.

FIG. 2 is a diagram showing how a typical SRAM memory array 200 is configured from individual memory cells. Memory array 200 is a single-port memory array (i.e., it consists of only single-port memory cells and supports only one memory access at a time), although multi-port memory arrays are also common. In memory array 200, words are arranged in rows, and bit positions are arranged in columns. For instance, word line 202 enables access to all of the bits in the memory word represented by that row, while word line 204 enables access to all of the bits in the succeeding memory word in the memory space provided by memory array 200.

Each column in memory array 200 represents a bit position within a word. Thus, bit line 206 and its complement bit line 208 represent a particular bit position, while bit line 210 and its complement bit line 212 represent the succeeding bit position. Note that all of memory cells corresponding to a particular bit position are connected to the same word lines. Thus, each individual memory cell in memory array 200 is accessed by row and column.

In "system on a chip" (SoC) applications, where a complete system of components is manufactured on a single integrated circuit (IC), SRAM arrays, such as that depicted in FIG. 2, may serve any of a variety of functions. The six-transistor SRAM cell depicted in FIG. 1 (memory circuit 100)

is regarded as being the most common SRAM cell currently in use in industry, since the six-transistor SRAM cell is fast and also suitable for high-density applications, where space in the IC layout is at a premium.

Since memory cells are typically implemented in a two-dimensional array, such as that depicted in FIG. 2, there will generally be some form of wire-length-related delay or latency between the time that a word line is strobed for a read operation and the time that the desired data appears on the bit lines at the periphery of the array (where the data can be latched or otherwise used). Self-timed memory circuits are often used to address this problem. In a typical self-timed memory circuit, a self-timed row decoder circuit is located at the top of the memory array so as to mimic the wire delay from the memory's control block (at the bottom of the array) up to the top row decoder of the memory. In the typical case, the self-timed row decoder circuit drives a signal that is allowed to propagate from the top of the array to the bottom of the array, where the sense amplifiers for the memory array are located. In this way, the maximum wire delay experienced by the data signals being read from the memory would be estimated, since the top row of memory cells would have the highest amount of wire delay from the perspective of the sense amplifiers at the bottom of the array.

In some applications programmability, or at least simplicity of the design process, becomes a priority. When rapid turnaround time or ease of manufacturing is needed, a "programmable" IC, which provides a standardized, generic set of components, such as logic gates or memory cells, can be "programmed" to implement the desired functionality. Thus, rather than laying out each individual transistor circuit in the design, a designer can simply make or break connections between the standard, generic components in the IC to achieve the desired result. Many devices that are called "programmable" may be programmed using some sort of programming apparatus, such as an FPGA (field-programmable gate array) programmer device. Another form of "programming" is "metal programming," in which one or more metal layers in the layout of an IC are used to form connections between standard components. "Metal programming" is useful for implementing IC designs that are to be commercially manufactured. In general, metal programming allows the designer the convenience of designing a circuit using a programmable device as a basis for the design, but "metal programming" is also rather conducive to mass manufacture, as the "programmed" part of the IC can simply be implemented as a layer in the usual fabrication process, rather than by having to "burn" the programmed part into the IC using a special programmer device.

In the design of metal-programmable memories, the self-timed architecture can restrict the number of ways in which the memory can be broken up. FIG. 5 is an example of a memory array design that illustrates this problem. In FIG. 5 a contiguous 512-by-512 array of memory cells with 2 input/output (I/O) blocks 504 and 506 (i.e., with two sets of sense amplifiers and related read/write circuitry) at the top and the bottom is segmented horizontal boundary line at a location of choice between the top and bottom of the array so as to form two adjacent memory arrays 500 and 502. Each of I/O blocks 504 and 506 operates only on its respective part of the original 512-by-512 memory array (i.e., on memory array 500 and memory array 502, respectively). This requires that self-timing row decoders 508 and 510 be located at the boundary line separating row decoder regions 507 and 509, which are the row decoders for memory array 500 and memory array 502, respectively. If a design calls for dividing the memory cell array in many areas by only changing metal routing layers, then self-timed row decoders and associated dummy bit cells (for reading the self-timing signals) must be placed in numerous places. This requires that free layout space be reserved at all of the locations in which a possible breakpoint or boundary line in the memory array can be located. This can use up a tremendous amount of layout area if many different possible breakpoints are desired.

Thus, a need exists for a self-timed memory circuit that allows a memory array to be broken into multiple segments without reserving large portions of layout space within the array for self-timing circuitry.

SUMMARY OF THE INVENTION

The present invention provides a novel design for a self-timed memory array in which segmentability and metal-programmability are supported while minimizing the amount of layout space required for implementing these functionalities. In a preferred embodiment, two self-timing row decoder circuits are utilized to support all possible array segmentations. The self-timing row decoder circuits are placed at the top and bottom of the array adjacent to respective I/O blocks. The self-timing signal is routed from the top (resp. bottom) of the array to a point halfway down (resp. up) the memory array and then back to a self-timing row decoder at the top (resp. bottom) of the array. This allows the wire delay for the activation of the real row decoders at the bottom (resp. top) of the memory array to be taken into account without having to place self-timing circuitry at both ends of the array. The same approach may also be used to account for the bitline wire delay from the bottom (resp. top) of the array to the sense amplifiers in the I/O block. In a preferred embodiment, dummy bitcells are placed at the top (resp. bottom) of the array close to the sense amplifiers, but the dummy bitcells will drive a bitline downward (resp. upward) to a point halfway across the array, from which the signal is routed back up (resp. down) to a dummy sense amplifier, so as to take into account the full bitline wire delay across the memory array.

In a preferred embodiment, memory arrays of various sizes may be implemented by way of metal programmability. By selectively including or eliminating metal routing layers from particular memory cells, additional routing area can be freed up for connecting other portions of a design. Further flexibility may be achieved by using a programmable gate array to implement circuitry for supporting a desired word size, so that a word size of choosing may be achieved from a memory array exhibiting minimum-column decoding.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 is a schematic diagram of a six-transistor single-port SRAM cell as known in the art;

FIG. 2 is a schematic diagram of a single-port SRAM array as known in the art;

FIG. 3 is a diagram of an integrated circuit layout for a six-transistor SRAM cell;

FIG. 4 is a diagram of an integrated circuit layout for a six-transistor SRAM cell that has been disabled through metal programming;

FIG. 5 is a diagram of a typical segmented memory array having self-timing circuitry as known in the art;

FIG. 6 is a diagram of a self-timed segmented memory array in accordance with a preferred embodiment of the present invention;

FIG. 7 is a diagram of circuitry for supporting a desired word size in a memory array made in accordance with a preferred embodiment of the present invention;

FIG. 8 is a diagram of a programmable integrated circuit for providing memory having a desired word size in accordance with a preferred embodiment of the present invention; and FIG. 9 is a flow diagram of a process of designing an integrated circuit in accordance with a preferred embodiment of the present invention.

DETAILED DESCRIPTION

FIG. 6 is a diagram of a self-timed memory array design in accordance with a preferred embodiment of the present invention. Memory array 600 and memory array 602 are separate memory arrays formed by dividing a base design for a larger memory array into two segments as in FIG. 5. Unlike the memory design of FIG. 5, however, this preferred embodiment of the present invention is designed with the self-timing circuitry for each memory array residing on a single side of the array. With respect to memory array 600, for example, a self-timing row decoder 610 resides on the same side of the memory array 600 as I/O block 604 (i.e., the "top" of memory array 600, as depicted in FIG. 6). A metal routing path 620 extends midway into row decoder region 607 of memory array 600 such that the wire delay experienced along routing path 620 is approximately the same as would be experienced along a wiring path extending from a row decoder at the bottom of row decoder region 607 to the top of row decoder region 607. Thus, self-timing row decoder 610, by receiving a self-timing signal that travels along routing path 620 into row decoder region 607 of memory array 600 and back again, simulates the effect of having a self-timing row decoder at the boundary between row decoder region 607 and row decoder region 609 so that extra layout space for row-decoding circuitry at that boundary need not be allocated in the design. Similarly, self-time row decoder 608 receives a self-timing signal along routing path 622 that extends into row decoder region 609 of memory array 602 and back, so as to simulate the effect of placing self-timing circuitry at the boundary between memory array 600 and memory array 602.

A similar self-timing apparatus may be employed for approximating the wire delay experienced on a bit line in a memory array. With respect to memory array 602, for example, dummy bit cell 618 emits a signal that travels along routing path 624. Routing path 624 extends about midway into memory 602 before returning to dummy sense amplifier 616 in I/O block 606. The round-trip wire delay approximates the delay that would be experienced along a bit line from a memory cell (bit cell) residing at the upper edge of memory array 602 down to a sense amplifier in I/O block 606, but without requiring additional circuitry between memory arrays 600 and 602.

An additional advantage to this self-timing memory design is that it allows unused portions of a memory array to be freed up for metal routing. For example, suppose that a given ASIC (application-specific integrated circuit) design does not require the fully memory capacity of an available memory array. With respect to FIG. 6, one could suppose that only memory 602 was needed for the particular application. Since the self-timing circuitry all resides on the bottom half of memory array 602 (rather than the typical case of extending from the top of memory array 600 down to the bottom of memory array 602, if one considers memory arrays 600 and 602 to form one larger memory array), memory array 600 (the unused portion of the larger memory array) can be used for routing other signals without interference from self-timing signals.

More specifically, if we turn our attention to FIG. 3, which is a layout diagram of a typical SRAM cell, we notice that an SRAM cell (like any integrated circuit) is made up of many regions of overlapping layers of different materials. Power supply rails 300 and 306 and bit lines 302 and 304 are layers of metal, while other portions of the SRAM cell are manufactured from positively and negatively doped silicon (e.g., P-diffusion region 314 and N-diffusion regions 312) or oxide (e.g., polysilicon region 310, which forms a word line). Different material layers are connected by way of contacts (e.g., contact 316), which may be ohmic contacts, vias, or other forms of contacts. In a preferred embodiment of the present invention, an SRAM cell residing in an unused portion of a memory array can be reclaimed for routing metal routing paths by eliminating the metal regions and contacts in the SRAM cell through metal programming, as shown in FIG. 4. Once the connectors that would connect the transistors of the SRAM cell to metal lines are eliminated, a designer is free to route metal lines over the unused SRAM cell as desired. Since in a preferred embodiment of the present invention, no metal routing paths are needed to support self-timing in unused memory array segments, routing paths in these unused memory segments are available without interference from routing paths needed for self-timing operation.

Further design flexibility may be afforded by allowing a designer to select a desired word size for use in addressing the memory array. FIG. 7 demonstrates how this may be accomplished. FIG. 7 shows a memory array 700 in accordance with a preferred embodiment of the present invention. Memory array 700 is designed for minimum-column decode. That is to say, memory array 700 presents output from all of its bit lines when a given word line is addressed (i.e., memory array 700 outputs the minimum number of columns, namely one). In the example provided in FIG. 7, memory array 700 has 80 bit lines. A multiplexer 702 is coupled to memory array 700 such that the address presented to multiplexer 702 at selection input 706 selects one of four 20-bit words that can be derived from the 80-bit single memory column. In a preferred embodiment, multiplexer 702 is constructed using programmable logic. FIG. 8 shows a programmable gate array 800 having a multi-line connection 804 to a self-timed memory array 802. Since programmable gate array 800 can be programmed to implement a multiplexer having any number of possible inputs, one skilled in the art could program gate array 800 to implement a multiplexer having the correct number of multiple-bit inputs to obtain a desired word size. Thus while FIG. 7 depicts a design that provides for a 20-bit word size, one skilled in the art could utilize a differently-programmed multiplexer with the same memory array to obtain a different word size, such as 40 bits, for example.

A design process used to produce metal-programmable memories in accordance with a preferred embodiment of the present invention is depicted in the form of a flow diagram in FIG. 9. A circuit designer may use a computer-based text editor program 900 or some other form of editing facility (whether graphical or text based) to input characteristics of a design to be implemented. Typically, this is performed using some form of hardware definition language, such as Verilog. These design characteristics will form a relatively high level description 902 of the memory system that can be fed into a compiler program 904 as input. Compiler 904 translates description 902 into a layout 906 by varying the metal layer(s) of a standard circuit layout so as to achieve a layout implementing an electrical circuit that functions according to the designer's requirements. Layout 906 can then be used to direct a fabrication process 908, as is known in the art. Since only the metal layer portion of the design is varied by the metal-programming process, when the circuit is fabricated, only those semiconductor masks that affect the metal-layer layout need be customized for the given design, and standardized masks can be used for the other circuit layers.

It is important to note that while the present invention has been described in the context of a fully functioning data processing system, those of ordinary skill in the art will appreciate that the processes of the present invention are capable of being distributed in the form of a computer readable medium of instructions or other functional descriptive material and in a variety of other forms and that the present invention is equally applicable regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system. Functional descriptive material is information that imparts functionality to a machine. Functional descriptive material includes, but is not limited to, computer programs, instructions, rules, facts, definitions of computable functions, objects, and data structures.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer-implemented method of implementing a self-timed memory in an integrated circuit comprising:
   receiving design characteristics for an integrated circuit application requiring a memory space;
   providing an integrated circuit layout of a memory array having a first side;
   selecting a portion of the memory array to be used as the memory space for the integrated circuit application;
   receiving a desired word size for the memory space;
   generating a programmable logic circuit coupled to the portion of the memory array such that the programmable logic circuit allows the portion of the memory array to be accessed using the desired word size;
   incorporating into the integrated circuit layout a self-timing signal-producing circuit located at the first side;
   incorporating into the integrated circuit layout a self-timing signal-reading circuit located at the first side; and
   incorporating into the integrated circuit layout a routing path connecting the self-timing signal-producing circuit to the self-timing signal-reading circuit, wherein the routing path extends into the memory array for a sufficient length such that a signal produced by the self-timing signal-producing circuit and detected by the self-timing signal-reading circuit approximates timing behavior of the memory array.

2. The computer-implemented method of claim 1, further comprising:
   eliminating a metal routing layer from an unused portion of the memory array.

3. The computer-implemented method of claim 2, further comprising:
   incorporating a metal routing path into the integrated circuit layout, such that metal routing path is routed over the unused portion of the memory array, but is not connected to unused memory cells in the unused portion of the memory array.

4. A computer recordable medium comprising functional descriptive material that, when executed by a computer, causes the computer to perform actions comprising:
   receiving design characteristics for an integrated circuit application requiring a memory space;
   providing an integrated circuit layout of a memory array having a first side;
   selecting a portion of the memory array to be used as the memory space for the integrated circuit application;
   receiving a desired word size for the memory space;
   generating a logic circuit design coupled to the portion of the memory array such that the logic circuit design allows the portion of the memory array to be accessed using the desired word size;
   incorporating into the integrated circuit layout a self-timing signal-producing circuit located at the first side;
   incorporating into the integrated circuit layout a self-timing signal-reading circuit located at the first side; and
   incorporating into the integrated circuit layout a routing path connecting the self-timing signal-producing circuit to the self-timing signal-reading circuit, wherein the routing path extends into the memory array for a sufficient length such that a signal produced by the self-timing signal-producing circuit and detected by the self-timing signal-reading circuit approximates timing behavior of the memory array.

5. The computer recordable medium of claim 4, further comprising additional functional descriptive material that, when executed by a computer, causes the computer to perform actions that include:
   eliminating a metal routing layer from an unused portion of the memory array.

6. The computer recordable medium of claim 5, comprising additional functional descriptive material that, when executed by a computer, causes the computer to perform actions that include:
   incorporating a metal routing path into the integrated circuit layout, such that metal routing path is routed over the unused portion of the memory array, but is not connected to unused memory cells in the unused portion of the memory array.

7. The computer recordable of claim 4, wherein the generated logic circuit design is a programmable logic circuit.

* * * * *